US009196691B2

(12) United States Patent
Hou et al.

(10) Patent No.: US 9,196,691 B2
(45) Date of Patent: Nov. 24, 2015

(54) METAL GATE ELECTRODE OF A FIELD EFFECT TRANSISTOR

(71) Applicant: TAIWAN SEMICONDUCTOR MANUFACTURNG COMPANY, LTD., Hsinchu (TW)

(72) Inventors: Cheng-Hao Hou, Hsinchu (TW); Peng-Soon Lim, Johor (TW); Da-Yuan Lee, Jhubei (TW); Xiong-Fei Yu, Hsinchu (TW); Chun-Yuan Chou, Taipei (TW); Fan-Yi Hsu, Toufen Town (TW); Jian-Hao Chen, Hsinchu (TW); Kuang-Yuan Hsu, Fongyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 42 days.

(21) Appl. No.: 14/018,087

(22) Filed: Sep. 4, 2013

(65) Prior Publication Data
US 2014/0004694 A1  Jan. 2, 2014

Related U.S. Application Data

(62) Division of application No. 13/189,732, filed on Jul. 25, 2011, now Pat. No. 8,546,885.

(51) Int. Cl.
*H01L 29/40* (2006.01)
*H01L 21/28* (2006.01)
*H01L 29/49* (2006.01)
*H01L 29/66* (2006.01)
*H01L 29/78* (2006.01)
*H01L 29/51* (2006.01)

(52) U.S. Cl.
CPC ........ *H01L 29/401* (2013.01); *H01L 21/28088* (2013.01); *H01L 29/4966* (2013.01); *H01L 29/66545* (2013.01); *H01L 29/51* (2013.01); *H01L 29/78* (2013.01); *H01L 2924/0002* (2013.01)

(58) Field of Classification Search
CPC ............ H01L 29/401; H01L 21/28088; H01L 29/4966; H01L 29/66545; H01L 29/78; H01L 29/51; H01L 2924/0002
USPC .................................................. 438/589, 591
See application file for complete search history.

(56) References Cited

U.S. PATENT DOCUMENTS

| 2003/0216038 A1 | 11/2003 | Madhukar et al. |
| 2006/0278934 A1 | 12/2006 | Nagahama |
| 2007/0262451 A1 | 11/2007 | Rachmady et al. |

FOREIGN PATENT DOCUMENTS

CN          101438389          5/2009

*Primary Examiner* — Peniel M Gumedzoe
(74) *Attorney, Agent, or Firm* — Hauptman Ham, LLP

(57) ABSTRACT

A method of fabricating a metal gate electrode of a field effect transistor includes forming a dielectric layer over an active region, and forming an opening in the dielectric layer. The method further includes partially filling the opening with a high-dielectric-constant material, partially filling the opening with a conformal first metal material over the high-dielectric-constant material, and filling the opening with a capping layer over the first metal material. The method further includes partially removing the first metal material and capping layer in the opening using a wet etching process. The method further includes fully removing the remaining capping layer in the opening using a wet etching process. The method further includes depositing a second metal material in the opening over the remaining first metal material, and planarizing the second metal material.

20 Claims, 9 Drawing Sheets

METAL GATE ELECTRODE OF A FIELD EFFECT TRANSISTOR

PRIORITY CLAIM

The present invention is a divisional of U.S. application Ser. No. 13/189,732, filed Jul. 25, 2011, the disclosure of which is incorporated herein by reference in its entirety.

FIELD OF THE INVENTION

The invention relates to integrated circuit fabrication and, more particularly, to a Field Effect Transistor with a metal gate electrode.

BACKGROUND

Semiconductor devices are used in a large number of electronic devices, such as computers, cell phones, and others. Semiconductor devices comprise integrated circuits (ICs) that are formed on semiconductor wafers by depositing many types of thin films of material over the semiconductor wafers, and patterning the thin films of material to form the ICs. The ICs include field-effect transistors (FETs), such as metal-oxide-semiconductor field effect transistors (MOSFETs).

As technology nodes shrink, in some IC designs, there has been a desire to replace the typically polysilicon gate electrode with a metal gate electrode to improve device performance with the decreased feature sizes. One process of forming the metal gate electrode is termed a "gate last" process in which the final metal gate electrode is fabricated after all of the other transistor components, which allows for a reduced number of subsequent processes, including high temperature processing, that must be performed after formation of the gate.

However, there are challenges to implementing such features and processes in complementary metal-oxide-semiconductor (CMOS) fabrication. As the gate length and spacing between devices decrease, these problems are exacerbated. For example, in a "gate last" fabrication process, it is difficult to achieve a low gate resistance for a FET because voids are generated in the metal gate electrode after metal layer deposition for gap filling of a high-aspect-ratio trench, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples of a "gate last" metal gate process, however, one skilled in the art may recognize applicability to other processes and/or use of other materials.

Figure 1:
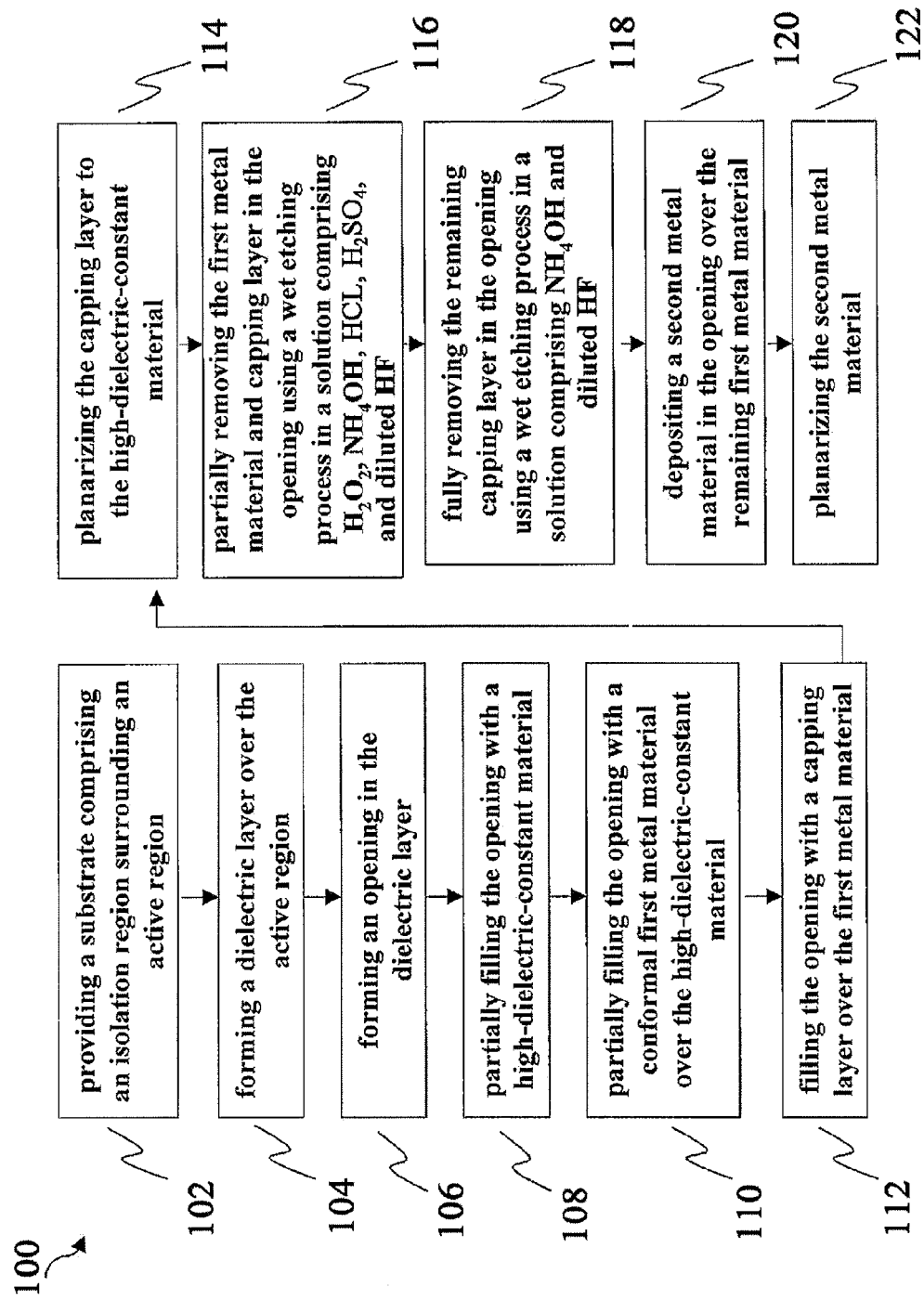
FIG. 1 is a flowchart illustrating a method of fabricating a metal gate electrode of a Field Effect Transistor according to various aspects of the present disclosure.

Referring to FIG. 1, illustrated is a flowchart of a method 100 of fabricating a metal gate electrode of a field effect transistor according to various aspects of the present disclosure. The method 100 begins with step 102 in which a substrate comprising an isolation region surrounding an active region is provided. The method 100 continues with step 104 in which a dielectric layer is formed over the active region. The method 100 continues with step 106 in which an opening is formed in the dielectric layer. The method 100 continues with step 108 in which the opening is partially filled with a high-dielectric-constant (high-k) material. The method 100 continues with step 110 in which the opening is partially filled with a conformal first metal material over the high-dielectric-constant material. The method 100 continues with step 112 in which the opening is filled with a capping layer over the first metal material. The method 100 continues with step 114 in which the capping layer is planarized to the high-dielectric-constant material. The method 100 continues with step 116 in which the first metal material and capping layer in the opening are partially removed using a wet etching process in a solution comprising $H_2O_2$, $NH_4OH$, HCl, $H_2SO_4$, and diluted HF. The method 100 continues with step 118 in which the remaining capping layer in the opening is fully removed using a wet etching process in a solution comprising $NH_4OH$ and diluted HF. The method 100 continues with step 120 in which a second metal material is deposited in the opening over the remaining first metal material. The method 100 continues with step 122 in which the second metal material is planarized. The discussion that follows illustrates an embodiment of a metal gate electrode of a field effect transistor that can be fabricated according to the method 100 of FIG. 1.

Figure 2A:
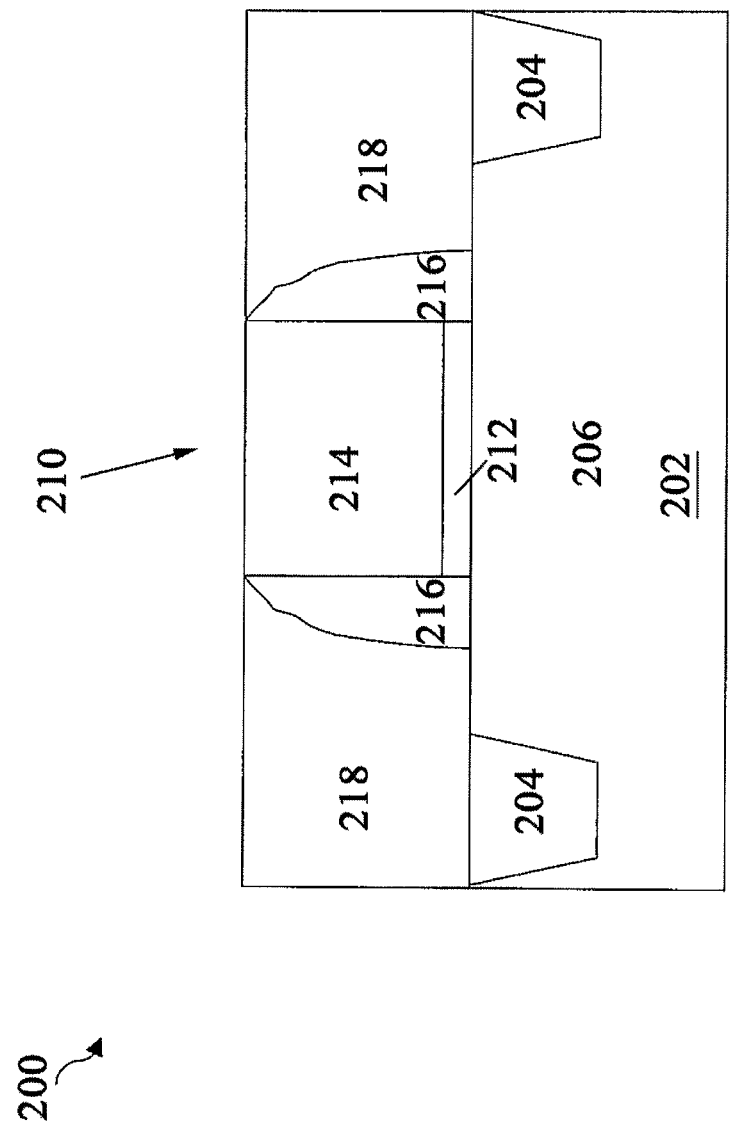
FIGS. 2A-H show schematic cross-sectional views of a Field Effect Transistor comprising a metal gate electrode at various stages of fabrication according to various aspects of the present disclosure.
Figure 2B:
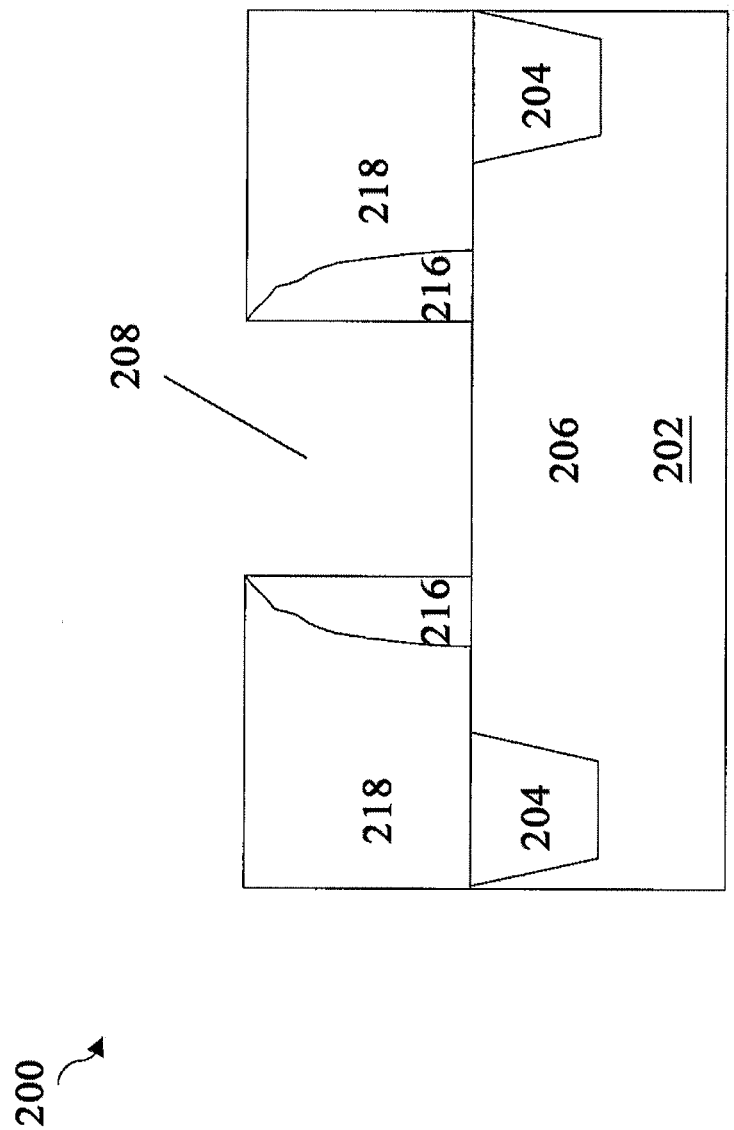
Figure 2C:
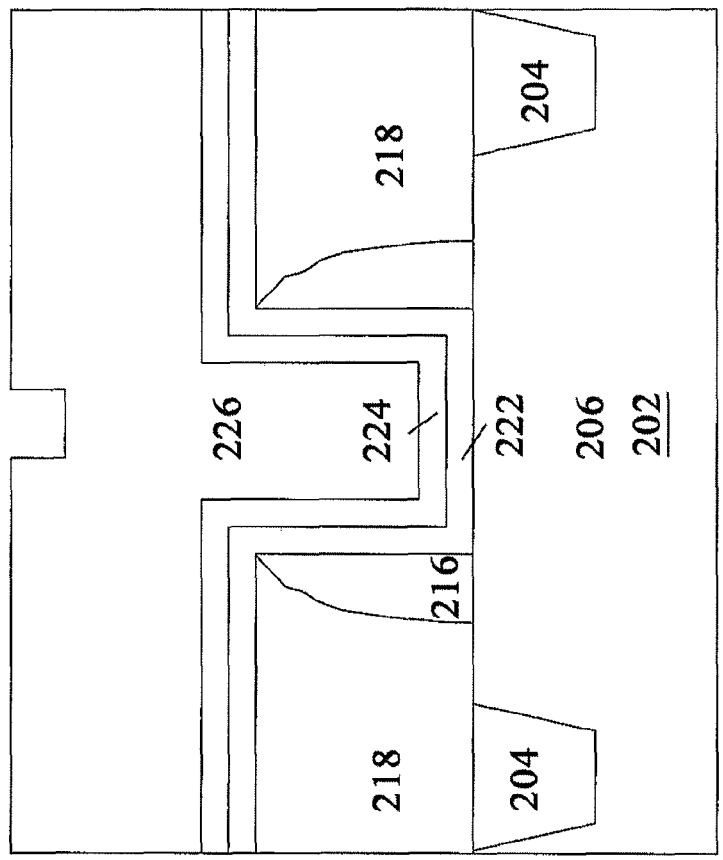
Figure 2D:
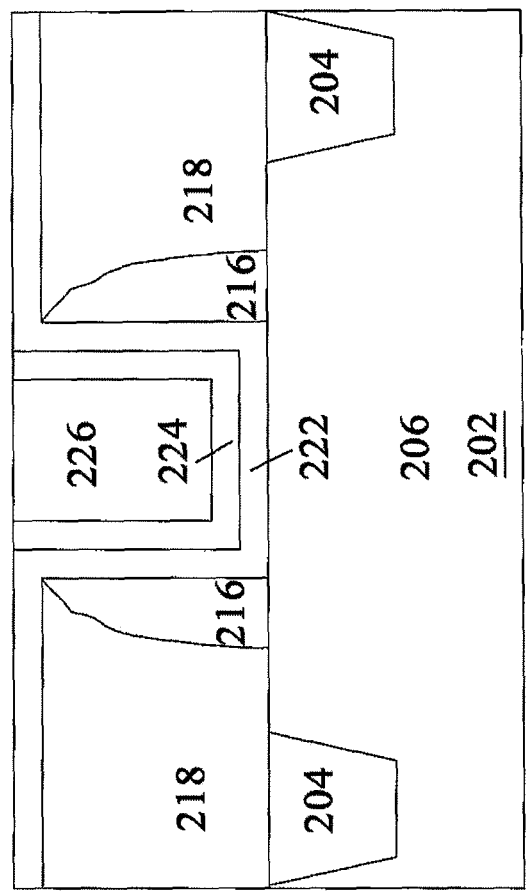
Figure 2E:
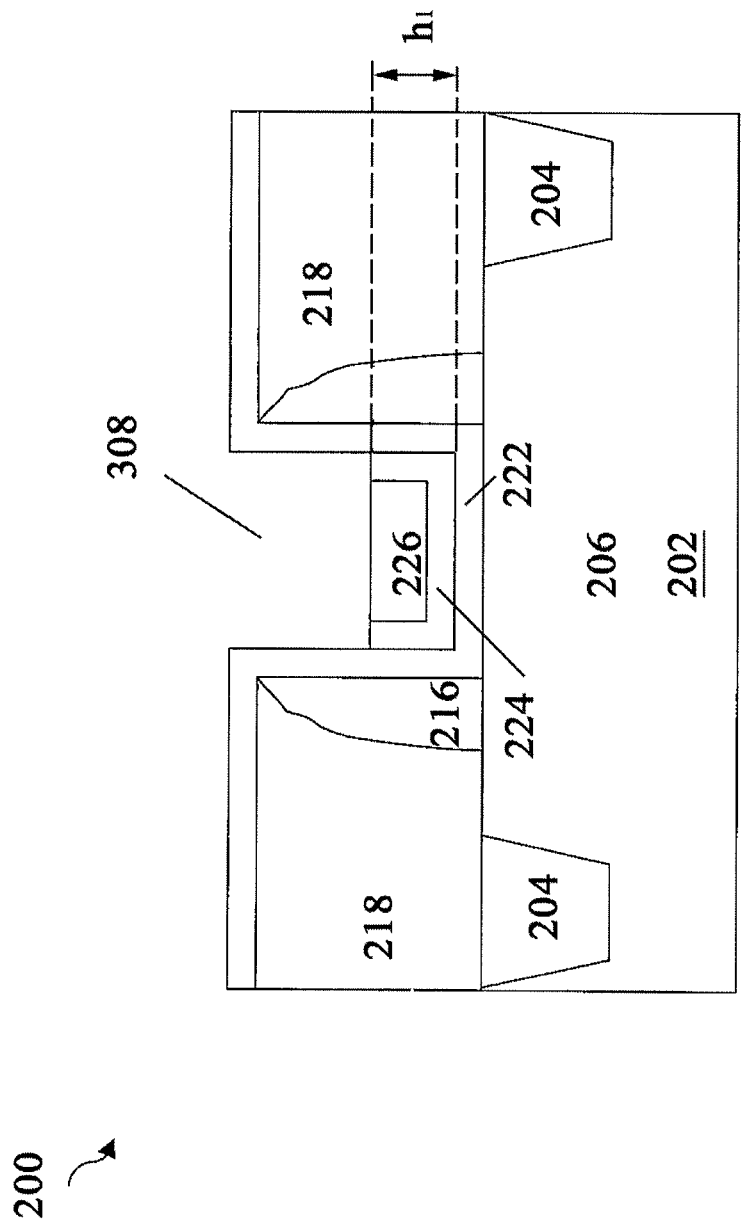
Figure 2F:
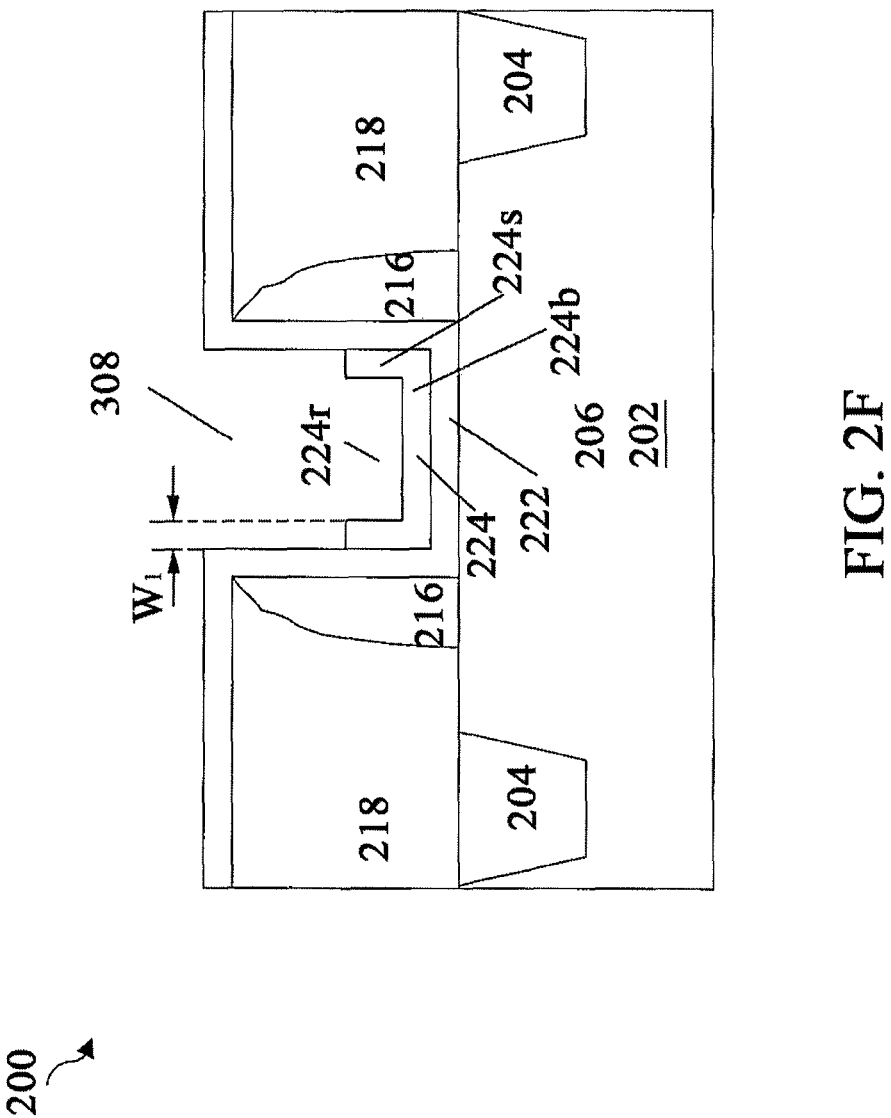
Figure 2G:
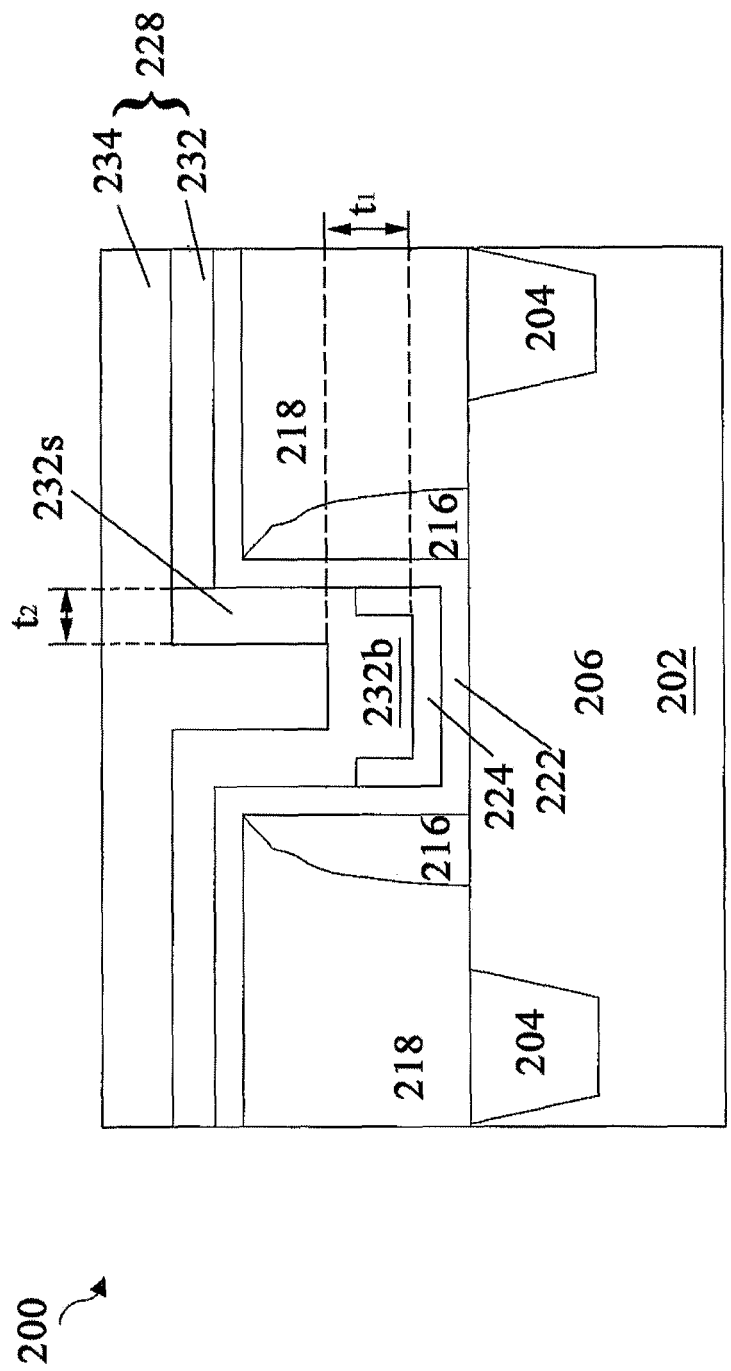
Figure 2H:
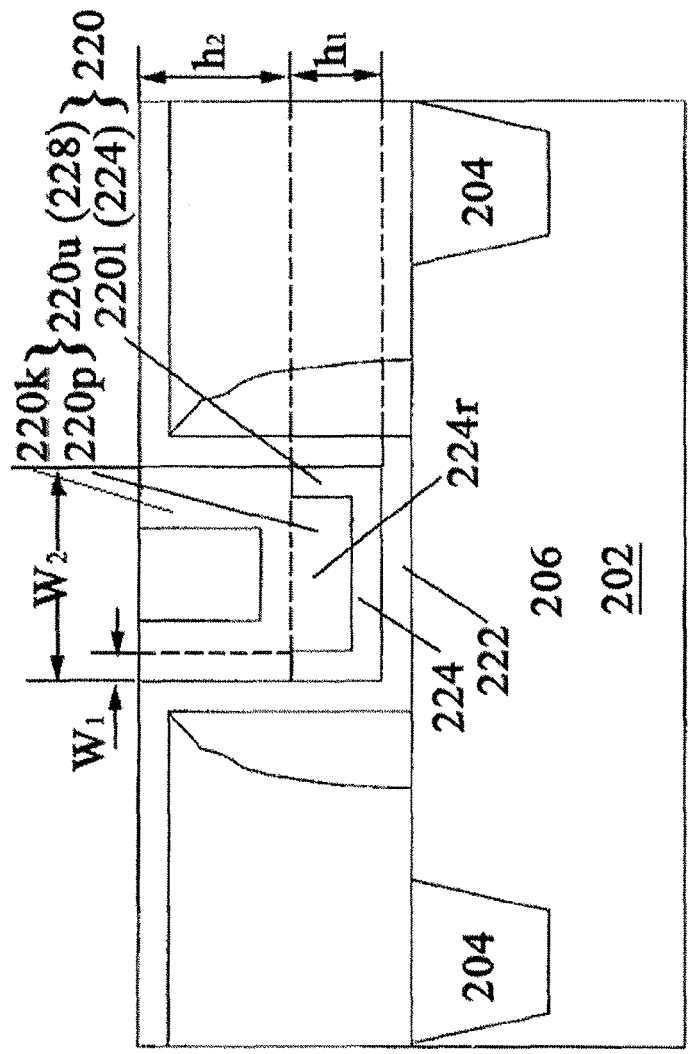

FIGS. 2A-H show schematic cross-sectional views of a field effect transistor (FET) 200 comprising a metal gate electrode 220 at various stages of fabrication according to various aspects of the present disclosure. It is noted that the method of FIG. 1 does not produce a completed FET 200. A completed FET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 2H are simplified for a better understanding of the inventive concepts of the present disclosure. For example, although the figures illustrate a metal gate electrode 220 for the FET 200, it is understood the integrated circuit (IC) may comprise a number of other devices comprising resistors, capacitors, inductors, fuses, etc.

Referring to FIG. 2A, a substrate 202 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxial (epi) layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the substrate 202 may comprise an isolation region 204 surrounding an active region 206. The active region 206 may include various doping configurations depending on design requirements. In some embodiments, the active region 206 may be doped with p-type or n-type dopants. For example, the active region 206 may be doped with p-type dopants, such as boron or $BF_2$; n-type dopants, such as phosphorus or arsenic; and/or combinations thereof. The active region 206 may be configured for an N-type metal-oxide-semiconductor field effect transistor (referred to as an NMOS) or for a P-type metal-oxide-semiconductor field effect transistor (referred to as a PMOS).

The isolation regions 204 may utilize isolation technology, such as local oxidation of silicon (LOCOS) or shallow trench isolation (STI), to define and electrically isolate the various active regions 206. In the present embodiment, the isolation region 204 comprises a STI. The isolation regions 204 may comprise materials such as silicon oxide, silicon nitride, silicon oxynitride, fluoride-doped silicate glass (FSG), a low-dielectric-constant (low-k) material, and/or combinations thereof. The isolation regions 204, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In a gate last process, a dummy gate structure 210 comprising a dummy oxide 212 and a dummy gate electrode 214 is formed on the substrate 202. The dummy gate structure 210 may be formed using any suitable process, including the processes described herein. In one example, the dummy oxide 212 and dummy gate electrode 214 are sequentially deposited on the substrate 202. In the present embodiment, the dummy oxide 212 may be formed of silicon oxide grown by a thermal oxidation process, having a thickness of about 10 to 30 Angstroms (Å). For example, the dummy oxide 212 can be grown by the rapid thermal oxidation (RTO) process or in an annealing process comprising oxygen.

In some embodiments, the dummy gate electrode 214 may comprise a single layer or multilayer structure. In the present embodiment, the dummy gate electrode 214 may comprise polysilicon. Further, the dummy gate electrode 214 may be doped polysilicon with the same or different doping. The dummy gate electrode 214 comprises any suitable thickness. In the present embodiment, the dummy gate electrode 214 comprises a thickness in the range of about 30 nm to about 60 nm. The dummy electrode 214 may be formed using a low-pressure chemical vapor deposition (LPCVD) process.

A layer of photoresist is formed over the dummy gate electrode 214 by a suitable process, such as spin-on coating, and patterned to form a patterned photoresist feature by a proper lithography patterning method. A width of the patterned photoresist feature is in the range of about 15 to 32 nm. The patterned photoresist feature can then be transferred using a dry etching process to the underlying layers (i.e., the dummy oxide 212 and the dummy gate electrode 214) to form the dummy gate structure 210. The photoresist layer may be stripped thereafter. It is understood that the above examples do not limit the processing steps that may be utilized to form the dummy gate structure 210.

After formation of the dummy gate structure 210, a dielectric layer 216 is deposited over the dummy gate structure 210 and extending over the active region 206. The dielectric layer 216 may be formed of silicon oxide, silicon nitride or other suitable materials by a chemical vapor deposition (CVD) process. A portion of the dielectric layer 216 over a top surface of the dummy gate structure 210 is removed using a dry etching process to form a pair of gate spacers 216 on opposite sidewalls of the dummy gate structure 210. For example, the dry etching process may be performed using $CH_2F_2$, $O_2$, and Ar as etching gases.

It is noted that the FET 200 may undergo other CMOS technology processing to form various features of the FET 200. As such, the various features are only briefly discussed herein. The various components of the FET 200 are formed prior to formation of the metal gate electrode 220 in a "gate last" process. The various components may comprise source/drain (n-type and p-type S/D) regions (not shown) and lightly doped source/drain (n-type and p-type LDD) regions (not shown) in the active region 206 on opposite sides of the metal gate electrode 220. The n-type S/D and LDD regions may be doped with P or As, and the p-type S/D and LDD regions may be doped with B or In.

Then, an interlayer dielectric (ILD) layer 218 is deposited over the dummy gate structure 210, the pair of gate spacers 216 and extending over the substrate 202. The ILD 218 may include an oxide formed by a high aspect ratio process (HARP) and/or high density plasma (HDP) deposition process. A chemical mechanical polishing (CMP) is performed on the ILD 218 to expose the dummy gate structure 210.

The dummy gate structure 210 may then be removed thereby forming an opening 208 in the dielectric layer 216 (i.e., between the gate spacers 216) (shown in FIG. 2B). The dummy gate electrode 214 may be removed using a wet etch and/or a dry etch process. In one embodiment, a wet etch process includes exposure to a hydroxide solution containing ammonium hydroxide, diluted HF, deionized water, and/or other suitable etchant solutions. In another embodiment, a dry etch process may be performed under a source power of about 650 to 800 W, a bias power of about 100 to 120 W, and a pressure of about 60 to 200 mTorr, using $Cl_2$, HBr and He as etching gases. Further, the dummy oxide 212 may be removed using a wet etch. The wet etch process includes exposure to a diluted HF solution, and/or other suitable etchant solutions.

Referring to FIG. 2C, following formation of the opening 208 in the dielectric layer 216, the opening 208 is partially filled with a high-dielectric-constant (high-k) material 222. In one embodiment, the high-k material 222 comprises certain metal oxides. Examples of metal oxides used for the high-k material 222 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the high-k material 222 comprises $HfO_x$ with a thickness in the range of about 10 to 30 angstroms. The high-k material 222 may be formed using a suitable process such as atomic layer deposition (ALD), chemical vapor deposition (CVD), physical vapor deposition (PVD), thermal oxidation, UV-ozone oxidation, or combinations thereof. The high-k material 222 may further comprise an interfacial layer (not shown) to reduce damage between the high-k material 222 and the substrate 202. The interfacial layer may comprise silicon oxide.

The opening 208 is partially filled with a conformal first metal material 224 over the high-k material 222. In the present embodiment, the conformal first metal material 224 is deposited before a second metal material 228 (shown in FIG. 2H) to reduce diffusion of a signal metal 228b to the high-k material 222. In one embodiment, the conformal first metal material 224 comprises a material selected from a group of TiN, TaN, and WN. The conformal first metal material 224 has a thickness ranging from 5 to 15 angstroms. The conformal first metal material 224 may be formed by CVD, PVD, or other suitable technique.

The opening 208 is filled with a capping layer 226 over the conformal first metal material 224. In some embodiments, the capping layer 226 may comprise a single layer or multilayer structure. In the present embodiment, the capping layer 226 may comprise polysilicon, amorphous silicon, or silicon nitride. Further, the capping layer 226 may be doped silicon with the same or different doping. The capping layer 226 comprises any suitable thickness. In the present embodiment, the capping layer 226 comprises a thickness in the range of about 45 nm to about 65 nm. The capping layer 226 may be formed using an LPCVD process.

Then, a chemical mechanical polishing (CMP) process is performed to remove a portion of the capping layer 226 and conformal first metal material 224 outside of the opening 208. Accordingly, the CMP process may stop when reaching the high-k material 222, and thus providing a substantially planar surface (shown in FIG. 2D).

The remaining capping layer 226 within the opening 208 may be removed, thereby forming a high-aspect-ratio trench for the FET 200. The high-aspect-ratio trench may impede metal material from entering into a bottom portion of the trench and generate voids in the trench, thereby increasing the likelihood of device instability and/or device failure.

Accordingly, the processing discussed below with reference to FIGS. 2E-2H may remove at least an upper portion of the conformal first metal material 224 to lower the aspect ratio of the trench to make it easier for further metal depositions into the trench. This can reduce void generation in a metal gate electrode in a high-aspect-ratio trench and upgrade device performance.

FIG. 2E shows the FET 200 of FIG. 2D after the conformal first metal material 224 and capping layer 226 in the opening 208 are partially removed using a wet etching process in a solution comprising $H_2O_2$, $NH_4OH$, HCl, $H_2SO_4$, and diluted HF. The etching process forms a trench 308 within the opening 208. The remaining first metal material 224 within the opening 208 may have a maximum height $h_1$ ranging from about 1.5 to about 45 nm. The height $h_1$ can be achieved through tuning various parameters of the etching process such as time and etching chemistry.

Referring to FIG. 2F, following partially removing the conformal first metal material 224 and capping layer 226 in the opening 208, the remaining capping layer 226 in the opening 208 is fully removed using a wet etching process in a solution comprising $NH_4OH$ and diluted HF. The process steps up to this point have provided a substrate having a low-aspect-ratio trench 308 to make it easier for further metal depositions into the trench 308. This can reduce void generation in a metal gate electrode in a high-aspect-ratio trench and upgrade device performance.

In the present embodiment, the remaining first metal material 224 within the opening 208 forms a lower portion 220l of the metal gate electrode 220 (shown in FIG. 2H). In one embodiment, the lower portion 220l is substantially U-shaped. In another embodiment, the lower portion 220l has a recess 224r, a bottom portion 224b and sidewall portions 224s, wherein each of the sidewall portions 224s has a first width $W_1$.

Referring to FIG. 2G, after removal of the remaining capping layer 226 in the opening 208, a second metal material 228 is deposited over the first metal material 224 to fill the trench 308. In the present embodiment, a work-function metal 232 is first deposited over the first metal material 224, and a signal metal 234 is then deposited over the work-function metal 232. The work-function metal 232 and signal metal 234 are combined and referred to as the second metal material 228. Further, the thickness of the second metal material 228 will depend on the depth of the trench 308. The second metal material 228 is thus deposited until the trench 308 is substantially filled.

In an NMOS embodiment, the second metal material 228 may comprise an N-work-function metal. In some embodiments, the N-work-function metal comprises a metal selected from a group of Ti, Ag, Al, TiAl, TiAlN, TaC, TaCN, TaSiN, Mn, and Zr. In some embodiments, the N-work-function metal may be formed by CVD, PVD, plating, spin-on, ALD, or other suitable technique. In a PMOS embodiment, the second metal material 228 comprises a P-work-function metal. In some embodiments, the P-work-function metal comprises a metal selected from a group of TiN, WN, TaN, and Ru. In some embodiments, the P-work-function metal may be formed by CVD, PVD, plating, spin-on, ALD, or other suitable technique.

In a PVD embodiment, the work-function metal 232 comprises a bottom portion 232b having a first thickness $t_1$ and sidewall portions 232s having a second thickness $t_2$ less than the first thickness $t_1$. In one embodiment, a ratio of the second thickness $t_2$ to the first thickness $t_1$ is from 0.5 to 0.9. In an ALD embodiment, the work-function metal 232 comprises a bottom portion 232b having a first thickness $t_1$ and sidewall portions 232s having a second thickness $t_2$ substantially equal to the first thickness $t_1$.

Further, the signal metal 234 may comprise a material selected from a group of Al, Cu, Co and W. The signal metal 234 may be formed by CVD, PVD, plating, spin-on, ALD, or other suitable technique. In some embodiments, the signal metal 234 may comprise a laminate. The laminate may further comprise a barrier metal layer, a linear metal layer or a wetting metal layer.

Referring to FIG. 2H, another CMP is performed to planarize the second metal material 228 after filling the trench 308. Since the CMP removes a portion of the second metal material 228 outside of the trench 308, the CMP process may stop when reaching the high-k material 222, and thus provide a substantially planar surface.

In the present embodiment, the first metal material 224 and the second metal material 228 in the opening 208 are combined and referred to as the metal gate electrode 220. In one embodiment, the second metal material 228 within the opening 208 forms an upper portion 220u of the metal gate electrode 220. In one embodiment, the upper portion 220u is substantially T-shaped. In some embodiments, the upper portion 220u has a protrusion 220p and a bulk portion 220k, wherein the bulk portion 220k has a second width $W_2$, wherein the protrusion 220p extends into the recess 224r of the lower portion 220l, wherein a ratio of the second width $W_2$ to the first width $W_1$ is from about 5 to 10. In some embodiments, the upper portion 220u has a minimum height $h_2$. A ratio of the maximum height ($h_1$) of the lower portion 220l to a minimum height ($h_2$) of the upper portion 220u is from 0.1 to 0.9. Accordingly, Applicant's method of fabricating a FET 200 may fabricate a void-free metal gate electrode to reduce gate resistance and upgrade device performance.

In one embodiment, a metal gate electrode for a field effect transistor comprises a lower portion formed of a first metal material, wherein the lower portion has a recess, a bottom portion and sidewall portions, wherein each of the sidewall portions has a first width; and an upper portion formed of a second metal material, wherein the upper portion has a protrusion and a bulk portion, wherein the bulk portion has a second width, wherein the protrusion extends into the recess, wherein a ratio of the second width to the first width is from about 5 to 10.

In another embodiment, a method of fabricating a metal gate electrode of a Field Effect Transistor comprises providing a substrate comprising an isolation region surrounding an active region; forming a dielectric layer over the active region; forming an opening in the dielectric layer; partially filling the opening with a high-dielectric-constant material; partially filling the opening with a conformal first metal material over the high-dielectric-constant material; filling the opening with a capping layer over the first metal material; planarizing the capping layer to the high-dielectric-constant material; partially removing the first metal material and capping layer in the opening using a wet etching process in a solution comprising $H_2O_2$, $NH_4OH$ and diluted HF; fully removing the remaining capping layer in the opening using a wet etching process in a solution comprising $NH_4OH$ and diluted HF; depositing a second metal material in the opening over the remaining first metal material; and planarizing the second metal material.

It is understood that the FET 200 may undergo further CMOS process flow to form various features such as contacts/vias, interconnect metal layers, dielectric layers, passivation layers, etc.

One aspect of this description relates to a method of fabricating a metal gate electrode of a field effect transistor. The method includes providing a substrate comprising an isolation region surrounding an active region and forming a dielectric layer over the active region. The method further includes forming an opening in the dielectric layer. The method further includes partially filling the opening with a high-dielectric-constant material, partially filling the opening with a conformal first metal material over the high-dielectric-constant material, and filling the opening with a capping layer over the first metal material. The method further includes planarizing the capping layer to the high-dielectric-constant material, and partially removing the first metal material and capping layer in the opening using a wet etching process in a solution comprising $H_2O_2$, $NH_4OH$, HCl, $H_2SO_4$ and diluted HF. The method further includes fully removing the remaining capping layer in the opening using a wet etching process in a solution comprising $NH_4OH$ and diluted HF. The method further includes depositing a second metal material in the opening over the remaining first metal material, and planarizing the second metal material.

Another aspect of this description relates to a method of fabricating a metal gate electrode of a field effect transistor. The method includes forming a dielectric layer over a substrate comprising an isolation region surrounding an active region, wherein the dielectric layer is over the active region. The method further includes forming an opening in the dielectric layer, and filling the opening, wherein filling the opening comprises filling the opening with a high-dielectric-constant material, a conformal first metal material over the high-dielectric-constant material, and a capping layer over the first metal material. The method further includes planarizing the capping layer to expose the high-dielectric-constant material. The method further includes partially removing the first metal material and capping layer in the opening using a wet etching process, the first metal material having a maximum thickness ranging from about 1.5 nanometers (nm) to 45 nm, and fully removing the remaining capping layer in the opening using a wet etching process in a solution comprising $NH_4OH$ and diluted HF. The method further includes depositing a second metal material in the opening over the remaining first metal material.

Still another aspect of this description relates to a method of fabricating a metal gate electrode of a field effect transistor. The method includes forming a dielectric layer over a substrate comprising an isolation region surrounding an active region, wherein the dielectric layer is over the active region. The method further includes forming an opening in the dielectric layer and forming a metal electrode in the opening. Forming the metal electrode includes forming a lower portion formed of a first metal material, wherein the lower portion has a recess, a bottom portion and sidewall portions, wherein each of the sidewall portions has a first width. Forming the metal electrode further includes forming an upper portion, wherein the upper portion has a protrusion and a bulk portion, wherein the bulk portion has a second width, wherein the protrusion extends into the recess, wherein a ratio of the second width to the first width is from about 5 to 10, and the upper portion comprises a second metal material surrounding a signal metal, the signal metal having a substantially constant width.

While the invention has been described by way of example and in terms of the exemplary embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a metal gate electrode of a field effect transistor comprising:
    forming a dielectric layer over a substrate comprising an isolation region surrounding an active region, wherein the dielectric layer is over the active region;
    forming an opening in the dielectric layer;
    partially filling the opening with a high-dielectric-constant material;
    partially filling the opening with a conformal first metal material over the high-dielectric-constant material;
    filling the opening with a capping layer over the first metal material;
    planarizing the capping layer to the high-dielectric-constant material;
    partially removing the first metal material and capping layer in the opening using a wet etching process in a solution comprising $H_2O_2$, $NH_4OH$, HCl, $H_2SO_4$ and diluted HF;
    fully removing the remaining capping layer in the opening using a wet etching process in a solution comprising $NH_4OH$ and diluted HF;
    depositing a second metal material in the opening over the remaining first metal material; and
    planarizing the second metal material.

2. The method of claim 1, wherein the first metal material comprises a material selected from a group of TiN, TaN, and WN.

3. The method of claim 1, wherein the second metal material comprises a work-function metal, wherein the work-function metal comprises a bottom portion having a first thickness and sidewall portions having a second thickness less than the first thickness.

4. The method of claim 1, wherein the second metal material comprises a work-function metal, wherein the work-function metal comprises a bottom portion having a first thickness and sidewall portions having a second thickness substantially equal to the first thickness.

5. The method of claim 4, wherein the second metal material comprises an N-work-function metal.

6. The method of claim 1, wherein the second metal material comprises a P-work-function metal.

7. A method of fabricating a metal gate electrode of a field effect transistor comprising:
   forming a dielectric layer over a substrate comprising an isolation region surrounding an active region, wherein the dielectric layer is over the active region;
   forming an opening in the dielectric layer;
   filling the opening, wherein filling the opening comprises filling the opening with a high-dielectric-constant material, a conformal first metal material over the high-dielectric-constant material, and a capping layer over the first metal material;
   planarizing the capping layer to expose the high-dielectric-constant material;
   partially removing the first metal material and capping layer in the opening using a wet etching process, the first metal material having a maximum thickness ranging from about 1.5 nanometers (nm) to 45 nm;
   fully removing the remaining capping layer in the opening using a wet etching process in a solution comprising $NH_4OH$ and diluted HF;
   depositing a second metal material in the opening over the remaining first metal material.

8. The method of claim 7, further comprising forming the isolation region in the substrate, wherein forming the isolation region comprises:
   etching a trench in the substrate; and
   filling the trench with a dielectric material.

9. The method of claim 8, wherein filling the trench with the dielectric material comprises forming a multi-layer structure in the trench.

10. The method of claim 7, further comprising forming a dummy gate structure on the substrate; wherein the dielectric layer is formed surrounding the dummy gate structure.

11. The method of claim 10, wherein forming the dummy gate structure comprises forming a dummy gate oxide using at least one of a rapid thermal oxidation process or an annealing process comprising oxygen.

12. The method of claim 10, wherein forming the dummy gate structure comprises forming a dummy oxide layer structure having a thickness ranging from about 10 Angstroms to about 30 Angstroms.

13. The method of claim 10, further comprising removing the dummy gate structure using a hydroxide wet etching solution comprising ammonium hydroxide and diluted HF.

14. The method of claim 10, further comprising removing the dummy gate structure using a dry etching gas comprising $Cl_2$, HBr and He.

15. The method of claim 7, wherein forming the dielectric layer comprises etching a deposited dielectric layer using a dry etching process, wherein the dry etching comprises using $CH_2F_2$, $O_2$ and Ar as etching gases.

16. A method of fabricating a metal gate electrode of a field effect transistor comprising:
   forming a dielectric layer over a substrate comprising an isolation region surrounding an active region, wherein the dielectric layer is over the active region;
   forming an opening in the dielectric layer;
   forming a metal electrode in the opening, wherein forming the metal electrode comprises:
      forming a lower portion formed of a first metal material, wherein the lower portion has a recess, a bottom portion and sidewall portions, wherein each of the sidewall portions has a first width;
      forming an upper portion, the upper portion comprising a second metal material, wherein the upper portion has a protrusion and a bulk portion, wherein the bulk portion has a second width, wherein the protrusion extends into the recess, wherein a ratio of the second width to the first width is from about 5 to about 10; and
      forming a signal metal over the upper portion, wherein the signal metal is formed having the second metal material surrounding the signal metal,
   wherein
      the signal metal is formed such that the upper portion has a first thickness between a first surface within the recess and a nearest bottom surface of the signal metal,
      the first surface within the recess extends between the sidewall portions,
      at least one of the sidewall portions has a second surface within the recess,
      the second surface extends from the first surface in a direction toward the signal metal,
      the second surface has a length from the first surface to an end of the second surface, and
      the first thickness is greater than the length of the second surface.

17. The method of claim 16, wherein forming the upper portion further comprises:
   forming a work-function metal, wherein the work-function metal comprises a bottom portion having the first thickness and sidewall portions having a sidewall thickness substantially equal to the first thickness; and
   forming the signal metal further comprises forming the signal metal over the bottom portion of the work-function metal.

18. The method of claim 17, wherein forming the signal metal further comprises forming the signal metal so that the protrusion is free of the signal metal.

19. The method of claim 17, wherein forming the work-function metal comprises forming a P-work-function metal comprising a metal selected from the group consisting of TiN, WN, TaN, and Ru.

20. The method of claim 17, wherein forming the work-function metal comprises forming an N-work-function metal comprising a metal selected from the group consisting of Ti, Ag, Al, TiAl, TiAlN, TaC, TaCN, TaSiN, Mn, and Zr.

* * * * *